United States Patent
Cheng et al.

(10) Patent No.: US 10,395,988 B1
(45) Date of Patent: Aug. 27, 2019

(54) VERTICAL FET TRANSISTOR WITH REDUCED SOURCE/DRAIN CONTACT RESISTANCE

(71) Applicant: INTERNATIONAL BUSINESS MACHINES CORPORATION, Armonk, NY (US)

(72) Inventors: Kangguo Cheng, Schenectady, NY (US); Zheng Xu, Wappingers Falls, NY (US); Ruqiang Bao, Niskayuna, NY (US); Zhenxing Bi, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 11 days.

(21) Appl. No.: 15/949,544

(22) Filed: Apr. 10, 2018

(51) Int. Cl.
*H01L 29/66* (2006.01)
*H01L 21/8234* (2006.01)
(Continued)

(52) U.S. Cl.
CPC .... *H01L 21/823431* (2013.01); *H01L 21/764* (2013.01); *H01L 21/823418* (2013.01); *H01L 21/823468* (2013.01); *H01L 21/823481* (2013.01); *H01L 27/0886* (2013.01); *H01L 29/0653* (2013.01); *H01L 29/0847* (2013.01); *H01L 29/45* (2013.01); *H01L 29/456* (2013.01); *H01L 29/4966* (2013.01); *H01L 29/4991* (2013.01); *H01L 29/517* (2013.01); *H01L 29/518* (2013.01); *H01L 29/6653* (2013.01); *H01L 29/6656* (2013.01); *H01L 29/66545* (2013.01); *H01L 29/66795* (2013.01)

(58) Field of Classification Search
CPC .......... H01L 29/0886; H01L 21/02271; H01L 21/31111; H01L 21/823418; H01L 21/823431; H01L 21/823468; H01L 29/45; H01L 29/4966; H01L 29/4991; H01L 29/6653; H01L 29/6656; H01L 29/66545; H01L 29/66795
See application file for complete search history.

(56) References Cited

U.S. PATENT DOCUMENTS

| | | |
|---|---|---|
| 4,343,015 A | 8/1982 | Baliga et al. |
| 4,985,740 A | 1/1991 | Shenai et al. |

(Continued)

*Primary Examiner* — Ermias T Woldegeorgis
(74) *Attorney, Agent, or Firm* — Tutunjian & Bitetto, P.C.; Vazken Alexanian (57) ABSTRACT

A method is presented for reducing contact resistance and parasitic capacitance. The method includes forming a plurality of fins over a semiconductor substrate, forming a bottom source/drain region between the plurality of fins, forming a bottom spacer over the bottom source/drain region, forming high-k metal gates over the bottom spacers, and forming a top spacer over the high-k metal gates. The method further includes forming an interlayer dielectric (ILD) over the top spacer, recessing the ILD to expose top sections of the plurality of fins, depositing an epitaxial material over each of the top sections of the plurality of fins, forming a dielectric film over the epitaxial material such that air-gaps are created between the top sections of the plurality of fins and recessing the dielectric film to expose top sections of the epitaxial material and to deposit a silicide metal liner and a conductive material thereon.

20 Claims, 7 Drawing Sheets

(51) Int. Cl.
*H01L 27/088* (2006.01)
*H01L 29/06* (2006.01)
*H01L 29/08* (2006.01)
*H01L 29/51* (2006.01)
*H01L 21/764* (2006.01)
*H01L 29/45* (2006.01)
*H01L 29/49* (2006.01)

(56) References Cited

U.S. PATENT DOCUMENTS

| | | |
|---|---|---|
| 4,998,151 A | 3/1991 | Korman et al. |
| 5,624,860 A | 4/1997 | Plumton et al. |
| 5,910,665 A | 6/1999 | Plumton et al. |
| 6,097,046 A | 8/2000 | Plumton |
| 7,087,472 B2 | 8/2006 | Hadizad |
| 7,129,544 B2 | 10/2006 | Hadizad |
| 7,170,126 B2 | 1/2007 | Cheng et al. |
| 7,736,979 B2 | 6/2010 | Farrow et al. |
| 8,076,717 B2 | 12/2011 | Sandhu et al. |
| 8,253,191 B2 | 8/2012 | Sandhu et al. |
| 8,274,110 B2 | 9/2012 | Sandhu et al. |
| 8,723,252 B2 | 5/2014 | Sandhu et al. |
| 9,299,835 B1 | 3/2016 | Anderson et al. |
| 9,443,982 B1 * | 9/2016 | Balakrishnan .... H01L 29/66742 |
| 9,530,700 B1 | 12/2016 | Mallela et al. |
| 9,640,636 B1 | 5/2017 | Bentley et al. |
| 9,716,170 B1 | 7/2017 | Cheng et al. |
| 9,735,253 B1 | 8/2017 | Bi et al. |
| 9,748,380 B1 | 8/2017 | Lie et al. |
| 9,853,028 B1 | 12/2017 | Cheng et al. |
| 9,859,166 B1 | 1/2018 | Cheng et al. |
| 2007/0146008 A1 | 6/2007 | Tak et al. |
| 2013/0161732 A1 | 6/2013 | Hwang et al. |
| 2017/0373159 A1 | 12/2017 | Cheng et al. |

* cited by examiner

VERTICAL FET TRANSISTOR WITH REDUCED SOURCE/DRAIN CONTACT RESISTANCE

BACKGROUND

Technical Field

The present invention relates generally to semiconductor devices, and more specifically, to forming a vertical field effect transistor (FET) with reduced source/drain contact resistance.

Description of the Related Art

A FET is a transistor having a source, a gate, and a drain. The action of the FET depends on the flow of majority carriers along a channel between the source and drain that runs past the gate. Current through the channel, which is between the source and drain, is controlled by the transverse electric field under the gate. More than one gate (multi-gate) can be used to more effectively control the channel. The length of the gate determines how fast the FET switches, and can be about the same as the length of the channel. Multi-gate FETs are considered to be promising candidates to scale down CMOS FET technology. However, such small dimensions necessitate greater control over performance issues such as short channel effects, punch-through, metal-oxide semiconductor (MOS) leakage current and the parasitic resistance that is present in a multi-gate FET.

SUMMARY

In accordance with an embodiment, a method is provided for reducing contact resistance and parasitic capacitance. The method includes forming a plurality of fins over a semiconductor substrate, forming a bottom source/drain region between the plurality of fins, forming a bottom spacer over the bottom source/drain region, forming high-k metal gates over the bottom spacer, and forming a top spacer over the high-k metal gates. The method further includes forming an interlayer dielectric (ILD) over the top spacer, recessing the ILD to expose top sections of the plurality of fins, depositing an epitaxial material over the top sections of the plurality of fins, forming a dielectric film over the epitaxial material such that air-gaps are created between the top sections of the plurality of fins, and recessing the dielectric film to expose top sections of the epitaxial material and to deposit a silicide metal liner and a conductive material thereon.

In accordance with another embodiment, a method is provided for reducing contact resistance and parasitic capacitance. The method includes forming a plurality of fins over a semiconductor substrate, forming high-k metal gates between the plurality of fins, depositing an interlayer dielectric (ILD) between the plurality of fins, recessing the ILD to expose top sections of the plurality of fins, depositing an epitaxial material over each of the top sections of the plurality of fins, and forming a low-k dielectric film over the epitaxial material such that air-gaps are created between the top sections of the plurality of fins.

In accordance with yet another embodiment, a semiconductor structure is provided for reducing contact resistance and parasitic capacitance. The semiconductor structure includes a plurality of fins disposed over a semiconductor substrate, a bottom source/drain region disposed between the plurality of fins, a bottom spacer disposed over the bottom source/drain region, high-k metal gates disposed over the bottom spacer, and a top spacer disposed over the high-k metal gates. The semiconductor structure further includes an interlayer dielectric (ILD) disposed over the top spacer such that top sections of the plurality of fins are exposed, an epitaxial material disposed over each of the top sections of the plurality of fins, a dielectric film disposed over the epitaxial material such that air-gaps are created between the top sections of the plurality of fins, and a silicide metal liner and a conductive material disposed over the exposed top sections of the epitaxial material after recessing the dielectric film.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for forming vertical field effect transistors (FET) having source/drain epitaxy with low contact resistance and reduced parasitic capacitance and insertion loss. The size of FETs has been successfully reduced through the use of one or more fin-shaped channels. A FET employing such a channel structure can be referred to as a FinFET. Previously, complementary metal-oxide semiconductor (CMOS) devices were substantially planar along the surface of the semiconductor substrate, the exception being the FET gate that was disposed over the top of the channel. Fins break from this paradigm by using a vertical channel structure in order to maximize the surface area of the channel that is exposed to the gate. The gate controls the channel more strongly because it extends over more than one side (surface) of the channel. One challenge in fabricating multi-gate FETs is the high parasitic resistance due to the ultra-thin body channel.

Embodiments in accordance with the present invention provide methods and devices for reducing parasitic contact resistance by employing an increased silicidation area and a low-k liner with air-gaps therebetween, which further reduces parasitic capacitance and insertion loss.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
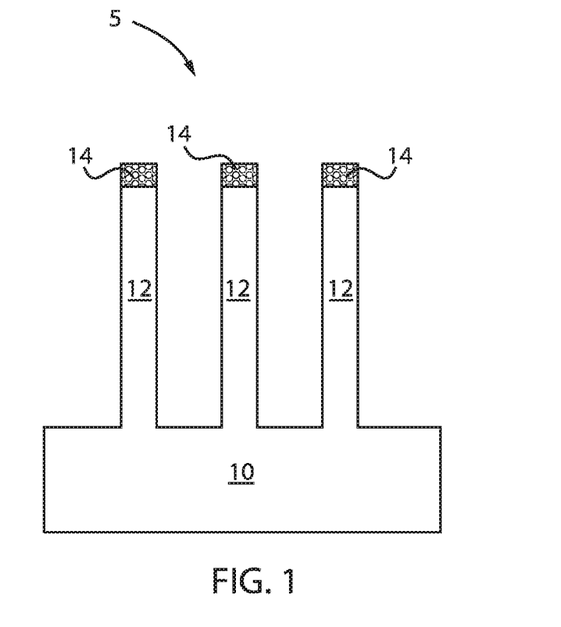
FIG. 1 is a cross-sectional view of a semiconductor structure including a plurality of fins formed over a semiconductor substrate, the fins including a hardmask thereon, in accordance with an embodiment of the present invention.

FIG. 1 is a cross-sectional view of a semiconductor structure including a plurality of fins formed over a semiconductor substrate, the fins including a hardmask thereon, in accordance with an embodiment of the present invention.

The semiconductor structure 5 includes a substrate 10 and a plurality of fins 12 formed thereon. Each of the plurality of fins 12 includes a hardmask 14 thereon. Channels or troughs or trenches are formed between the plurality of fins 12. The plurality of fins 12 have a width equal to the width of the hardmask 14.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor.

The plurality of fin structures 12 are formed from the substrate 10, which includes a semiconductor material including, but not limited to Si, strained Si, SiC, SiGe, SiGeC, Si alloys, Ge, Ge alloys, GaAs, InAs, InP as well as other III/V and II/VI compound semiconductors. The plurality of fin structures 12 are etched using a reactive ion etch (RIE) or the like. The etching can include a dry etching process such as, for example, reactive ion etching, plasma etching, ion etching or laser ablation. The etching can further include a wet chemical etching process in which one or more chemical etchants are employed to remove portions of the layers.

The plurality of fins 12 can be, e.g., silicon (Si) fins. In another exemplary embodiment, the plurality of fins 12 can be, e.g., silicon germanium (SiGe) fins. Yet in another exemplary embodiment, some of fins 12 can be a material that is different from the other fins. For example, some fins can be silicon fins while others can be silicon germanium (SiGe) fins. One skilled in the art can contemplate forming fins 12 from any type of materials.

The overall size, shape and configuration of the trenches and the fin structures 12 can vary depending on the particular application. The depth and width of the trenches as well as the height and width of the fin structures 12 can vary depending upon the particular application. In one illustrative embodiment, the width of the trenches can range from about 8-30 nm. In some embodiments, the fin structures 12 can have a width within the range of about 5-20 nm. In some embodiments, the fin structures 12 can have a depth within the range of about 20-60 nm. The fin structures 12 can be formed to any desired pitch.

The hardmask 14 can be manufactured of silicon nitride (SiN), deposited using, for example, low pressure chemical vapor deposition (LPCVD). In other example embodiments, the hardmask 14 can include, but is not limited to, hafnium oxide ($HfO_2$) or tantalum nitride (TaN) or titanium nitride (TiN). In some embodiments, the hardmask 14 can include multiple layers, for example, silicon nitride on top of silicon oxide. In some embodiments, the vertical thickness of the hardmask 14 ranges from about 30 nm to about 150 nm. The hardmask 14 can be formed by any suitable patterning technique, including but not limited to, sidewall image transfer (SIT), self-aligned double patterning (SADP), self-aligned quadruple patterning (SAQP), lithography followed by etching, etc.

Figure 2:
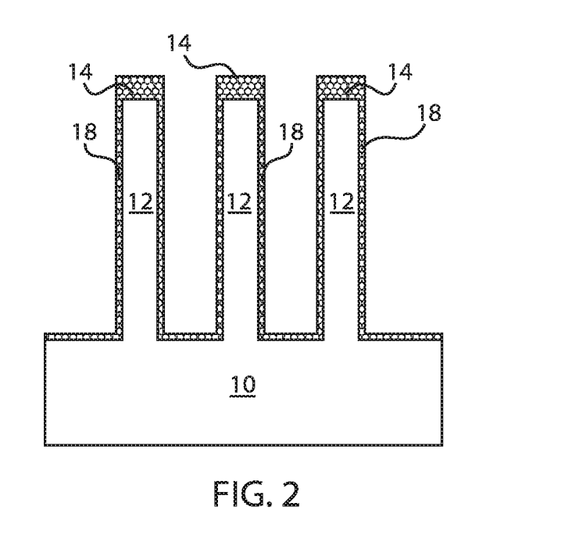
FIG. 2 is a cross-sectional view of the semiconductor structure of FIG. 1 where a dielectric liner is formed over the plurality of fins, in accordance with an embodiment of the present invention.

FIG. 2 is a cross-sectional view of the semiconductor structure of FIG. 1 where a dielectric liner is formed over the plurality of fins, in accordance with an embodiment of the present invention.

In an exemplary embodiment, dielectric liner 18 is deposited over the plurality of fins 12 and the hardmask 14. The dielectric liner 18 can have a composition that is selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H.

In some embodiments, the dielectric liner 18 includes multiple materials. The dielectric liner 18 can be formed by any suitable processing technique, including but not limited to, thermal oxidation, chemical oxidation, thermal nitridation, plasma oxidation, plasma nitridation, atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), in-situ radical assisted deposition, high temperature oxide deposition (HTO), low temperature oxide deposition (LTO), ozone/TEOS deposition, limited reaction processing CVD (LRPCVD), ultrahigh vacuum chemical vapor deposition (UHVCVD), metalorganic chemical vapor deposition (MOCVD), physical vapor deposition (PVD), sputtering, plating, evaporation, spin-on-coating, ion beam deposition, electron beam deposition, laser assisted deposition, chemical solution deposition, or any combination of those methods.

Figure 3:
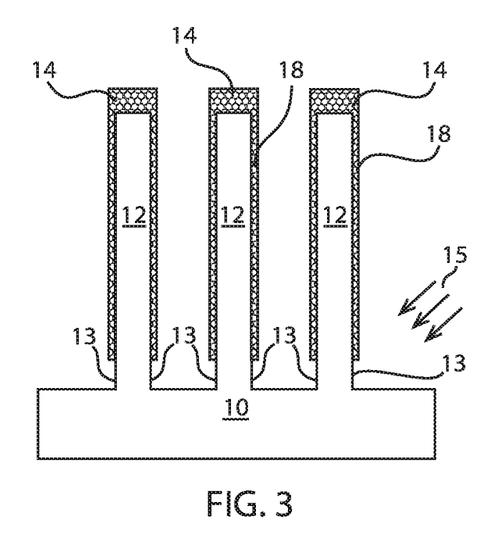
FIG. 3 is a cross-sectional view of the semiconductor structure of FIG. 2 where a lower portion of the dielectric liner is etched away to expose a lower section of each of the plurality of fins, in accordance with an embodiment of the present invention.

FIG. 3 is a cross-sectional view of the semiconductor structure of FIG. 2 where a lower portion of the dielectric liner is etched away to expose a lower section of each of the plurality of fins, in accordance with an embodiment of the present invention.

In an exemplary embodiment, a bottom portion of the dielectric liner 18 is etched, by, e.g., RIE 15, to expose sidewalls 13 of the plurality of fins 12 due to the lateral etch from RIE 15. Only a lower section of each of the plurality of fins 12 is exposed directly over the substrate 10.

Figure 4:
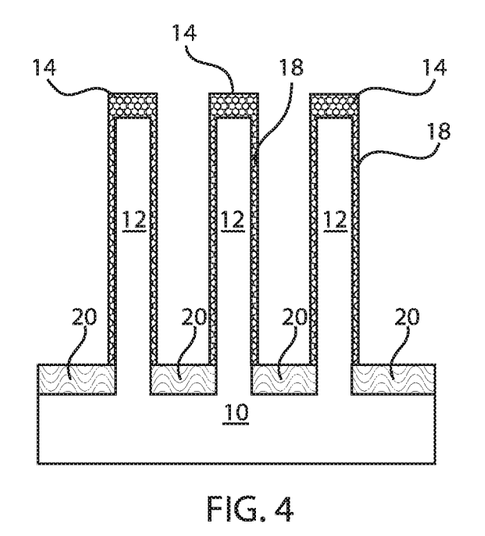
FIG. 4 is a cross-sectional view of the semiconductor structure of FIG. 3 where bottom source/drain regions are formed, in accordance with an embodiment of the present invention.

FIG. 4 is a cross-sectional view of the semiconductor structure of FIG. 3 where bottom source/drain regions are formed, in accordance with an embodiment of the present invention.

In an exemplary embodiment, a bottom source/drain region 20 is formed over the substrate 10 and in between the plurality of fins 12. The bottom source/drain region 20 contacts the exposed sidewalls 13 of the plurality of fins 12. Thus, no sidewalls of the plurality of fins 12 are exposed at this step.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Figure 5:
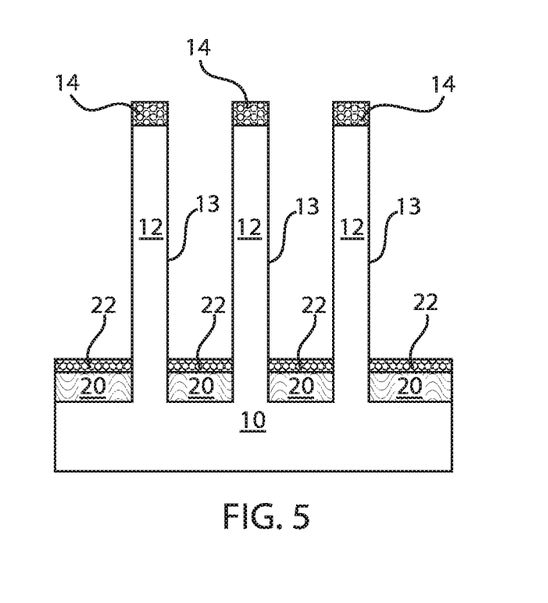
FIG. 5 is a cross-sectional view of the semiconductor structure of FIG. 4 where bottom spacers are formed over the bottom source/drain regions and the remaining dielectric liner is removed to expose sidewalls of the plurality of fins, in accordance with an embodiment of the present invention.

FIG. 5 is a cross-sectional view of the semiconductor structure of FIG. 4 where bottom spacers are formed over the bottom source/drain regions and the remaining dielectric liner is removed to expose sidewalls of the plurality of fins, in accordance with an embodiment of the present invention.

In an exemplary embodiment, a bottom spacer 22 is deposited over the bottom source/drain regions 20. The bottom spacers 22 can be formed by first providing a spacer material and then etching the spacer material. The spacer material can include any dielectric spacer material including, for example, a dielectric oxide, dielectric nitride, and/or dielectric oxynitride. In one example, the spacer material can include silicon oxide or silicon nitride (SiN). The spacer material can be provided by a deposition process including, for example, chemical vapor deposition (CVD), plasma enhanced chemical vapor deposition (PECVD), or physical vapor deposition (PVD). The etching of the spacer material can include a dry etch process such as, for example, a reactive ion etch (RIE). In some embodiments, the bottom spacer 22 has a thickness within the range of about 2-10 nm. Moreover, the remaining dielectric liner is stripped to expose the sidewalls 13 of each of the plurality of fins 12.

Figure 6:
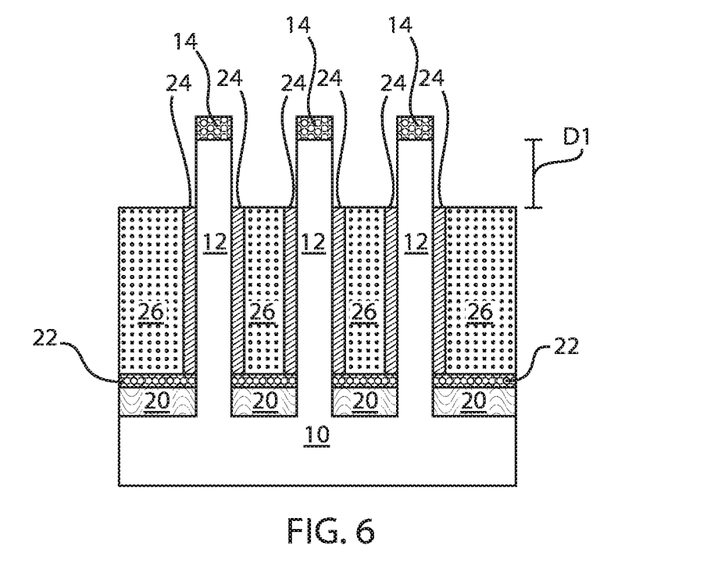
FIG. 6 is a cross-sectional view of the semiconductor structure of FIG. 5 where a high-k metal gate is formed between the plurality of fins, in accordance with an embodiment of the present invention.

FIG. 6 is a cross-sectional view of the semiconductor structure of FIG. 5 where a high-k metal gate is formed between the plurality of fins, in accordance with an embodiment of the present invention.

In an exemplary embodiment, a high k metal gate (HKMG) 24, 26 is formed within the channels or troughs of the plurality of fins 12. A top section of the plurality of fins 12 is exposed. Additionally, the hardmasks 14 of the plurality of fins 12 remain exposed. The top section of the plurality of fins 12 that is exposed is shown by designation "D1."

The gate dielectric 24 can be a high-k material having a dielectric constant greater than silicon oxide. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfOXN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from about 0.5 to about 3 and each value of y is independently from about 0 to about 2. In some embodiments, a multilayered gate dielectric structure including different gate dielectric materials, e.g. silicon oxide, and a high k gate dielectric can be formed.

The gate dielectric 24 can be formed by any deposition technique including, for example, chemical vapor deposition (CVD), plasma enhanced chemical vapor deposition (PECVD), physical vapor deposition (PVD), and sputtering, atomic layer deposition. In one embodiment of the present application, the gate dielectric 24 can have a thickness in a range from about 1 nm to about 10 nm. Other thicknesses that are lesser than or greater than the aforementioned thickness range can also be employed for the gate dielectric 24.

The gate conductor 26 can include any conductive metal material including, for example, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof. The gate conductor 26 can be formed utilizing any deposition process described herein.

Figure 7:
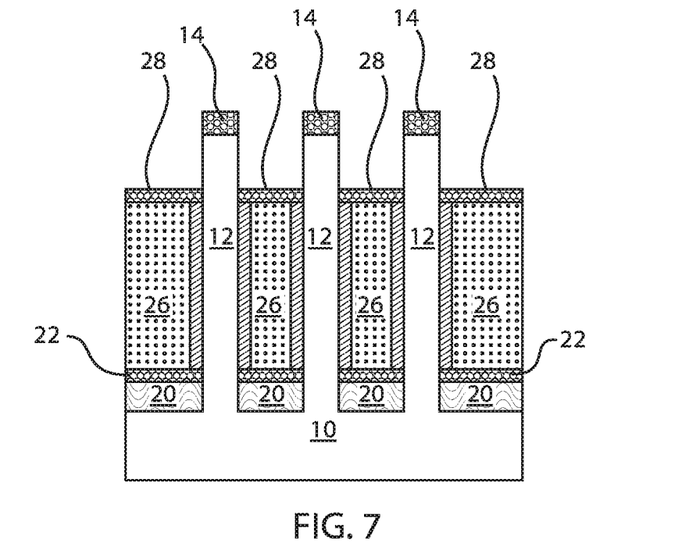
FIG. 7 is a cross-sectional view of the semiconductor structure of FIG. 6 where a top spacer is formed over the high-k metal gates, in accordance with an embodiment of the present invention.

FIG. 7 is a cross-sectional view of the semiconductor structure of FIG. 6 where a top spacer is formed over the high-k metal gates, in accordance with an embodiment of the present invention.

In an exemplary embodiment, a top spacer 28 is deposited over the high-k metal gate areas 24, 26. The top spacers 28 can be formed by first providing a spacer material and then etching the spacer material. The spacer material can include any dielectric spacer material including, for example, a dielectric oxide, dielectric nitride, and/or dielectric oxynitride. In one example, the spacer material can include silicon oxide or silicon nitride (SiN). The spacer material can be provided by a deposition process including, for example, chemical vapor deposition (CVD), plasma enhanced chemical vapor deposition (PECVD), or physical vapor deposition (PVD). The etching of the spacer material can include a dry etch process such as, for example, a reactive ion etch (RIE). In some embodiments, the top spacer 28 has a thickness within the range of about 2-10 nm.

Figure 8:
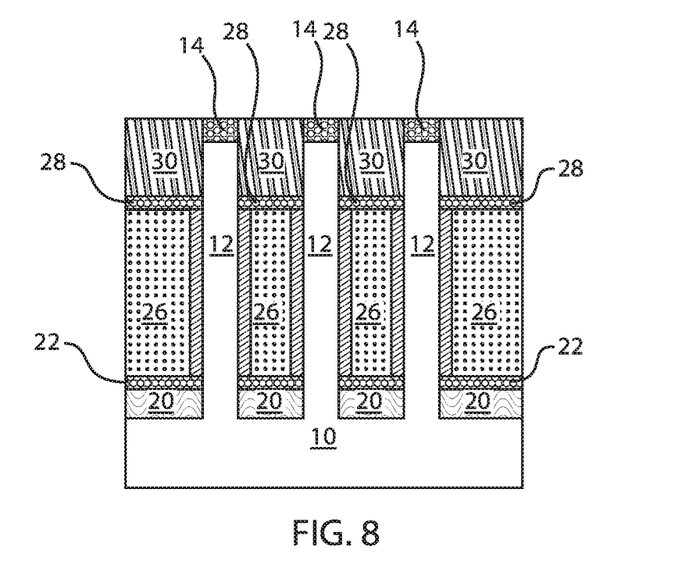
FIG. 8 is a cross-sectional view of the semiconductor structure of FIG. 7 where an interlayer dielectric (ILD) is formed over the top spacer, in accordance with an embodiment of the present invention.

FIG. 8 is a cross-sectional view of the semiconductor structure of FIG. 7 where an interlayer dielectric (ILD) is formed over the top spacer, in accordance with an embodiment of the present invention.

In an exemplary embodiment, an oxide fill takes place. The ILD oxide 30 can be planarized. The height of the ILD oxide 30 can be reduced by chemical-mechanical polishing (CMP) and/or etching. Therefore, the planarization process can be provided by CMP. Other planarization process can include grinding and polishing.

In one or more embodiments, the ILD oxide 30 can have a thickness in the range of about 10 nm to about 100 nm, or in the range of about 10 nm to about 50 nm.

The ILD 30 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™ other carbon containing materials, organo-inorganic materials such as spin-on glasses and silsesquioxane-based materials, and diamond-like carbon (DLC), also known as amorphous hydrogenated carbon, α-C:H. Additional choices for the ILD 30 include any of the aforementioned materials in porous form, or in a form that changes during processing to or from being porous and/or permeable to being non-porous and/or non-permeable.

Figure 9:
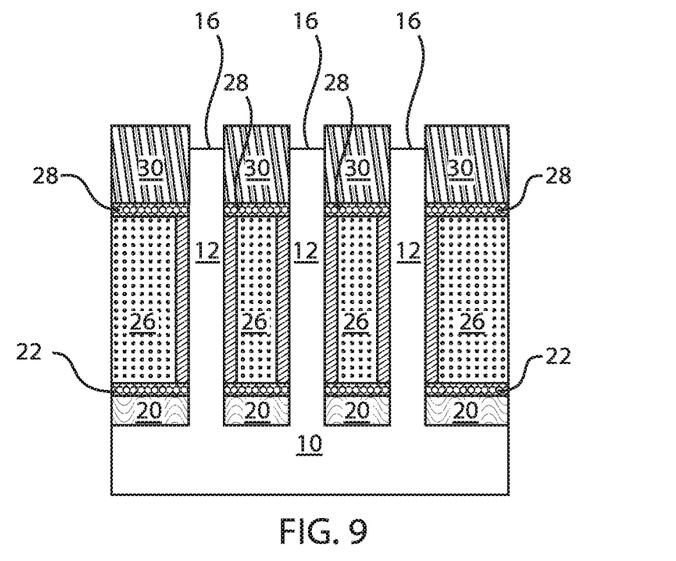
FIG. 9 is a cross-sectional view of the semiconductor structure of FIG. 8 where the hardmasks of the plurality of fins are removed, in accordance with an embodiment of the present invention.

FIG. 9 is a cross-sectional view of the semiconductor structure of FIG. 8 where the hardmasks of the plurality of fins are removed, in accordance with an embodiment of the present invention.

In an exemplary embodiment, the hardmasks 14 of each of the plurality of fins 12 are removed. A top surface 16 of each of the plurality of fins 12 is thus exposed. The ILD 30 remains intact.

Figure 10:
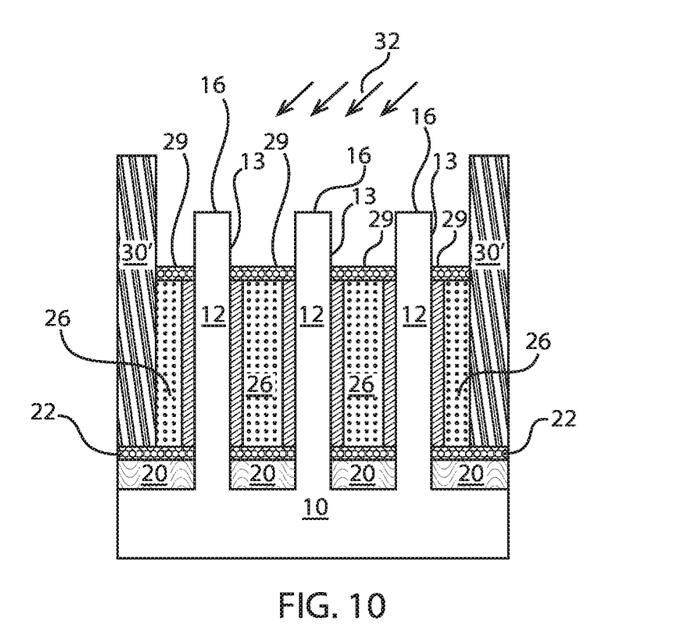
FIG. 10 is a cross-sectional view of the semiconductor structure of FIG. 9 where CA patterning was conducted followed with dielectric fill, and also reveals the selective ILD portions removed to expose a top section of each of the plurality of fins, as well as a top surface of the top spacer, in accordance with an embodiment of the present invention.

FIG. 10 is a cross-sectional view of the semiconductor structure of FIG. 9 where an additional patterning procedure is conducted followed with dielectric fill. It also reveals the following procedure of selective removal of ILD portions to expose a top section of each of the plurality of fins, as well as a top surface of the top spacer.

In an exemplary embodiment, the ILD 30 is selective removed by an etching process 32 such that only ILD sections 30' remain. Additionally, the sidewalls 13 of the plurality of fins 12 are now exposed. Also, the top surface 29 of the top spacers 28 are exposed. This step can refer to the CA contacts patterning. For example, during front end-of-the-line processing, a plurality of semiconductor devices (e.g., transistors, resistors, capacitors, and the like) are formed on a semiconductor wafer. The semiconductor devices are then locally interconnected during middle-of-the-line (MEOL) processing to produce an integrated circuit, such as a logic circuit or a memory cell. To enable the local interconnection of the semiconductor devices during MEOL processing, device-level plugs are formed in ohmic contact with the electrically-active areas of the substrate (commonly designated as "RX") and the gate conductors (commonly designated as "PC"), and local interconnect lines are formed in ohmic contact with the device-level plugs. In many cases, such as in certain replacement gate-based processes, the local interconnect lines and device-level plugs can be divided into three general categories: (i) trench-with-late-silicide contacts (referred to herein as "TS contacts") in ohmic contact with RX; (ii) local interconnect lines (referred to herein as "CA contacts") in ohmic contact with the TS contacts; and (iii) plugs in ohmic contact with PC (referred to herein as "CB contacts"). The TS, CA, and CB contacts are collectively referred to herein as the "local contacts."

Figure 11:
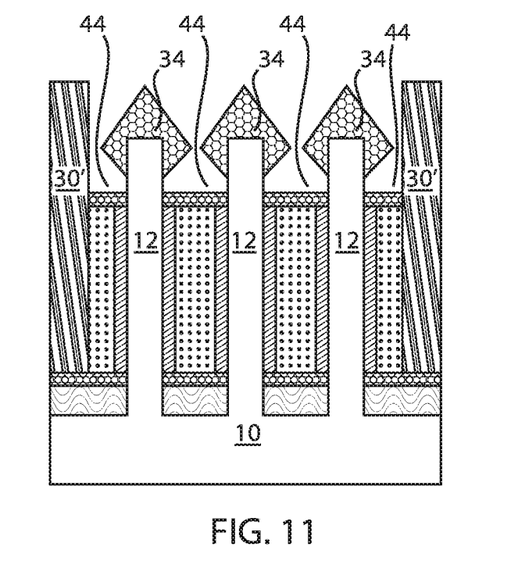
FIG. 11 is a cross-sectional view of the semiconductor structure of FIG. 10 where top source/drain regions are formed over the exposed top section of each of the plurality of fins by epitaxy, in accordance with an embodiment of the present invention.

FIG. 11 is a cross-sectional view of the semiconductor structure of FIG. 10 where top source/drain regions are formed over the exposed top section of each of the plurality of fins by epitaxy, in accordance with an embodiment of the present invention.

In an exemplary embodiment, an epitaxial material 34 is deposited over each of the top sections of the plurality of fins 12. The epitaxial material 34 can form top source/drain regions 34. The deposition of the epitaxial material 34 results in void regions 44 formed between the top source/drain regions 34.

The epitaxial material 34 can be doped with an n-type or p-type dopant to provide the conductivity type of the source and drain regions of the transistor. The epitaxial material 34 can be in-situ doped. By "in-situ" it is meant that the dopant that dictates the conductivity type, e.g., n-type or p-type, of the source and drain regions is introduced during the process step that forms the material layer for the source and drain regions, e.g., epitaxial material 34. An in-situ doped epitaxial material 34 having a p-type conductivity can be produced in a type IV semiconductor, such as a silicon including semiconductor or a germanium including semiconductor, by doping the type IV semiconductor material with group III-V elements of the periodic table of elements, such as boron (B). An in-situ doped epitaxial material 34 having an n-type conductivity can be produced in a type IV semiconductor, such as a silicon including semiconductor or a germanium including semiconductor, by doping the type IV semiconductor material with group V elements of the periodic table of elements, such as phosphorus (P) or arsenic (As). In some embodiments, uniform concentration of n-type or p-type dopant that is present in the in-situ doped epitaxial material 34 can range from $1 \times 10^{20}$ atoms/cm$^3$ to $2 \times 10^{21}$ atoms/cm$^3$. In another embodiment, the concentration of n-type or p-type dopant that is present in the in-situ doped epitaxial material 34 can range from $1 \times 10^{20}$ atoms/cm$^3$ to $1 \times 10^{21}$ atoms/cm$^3$.

Figure 12:
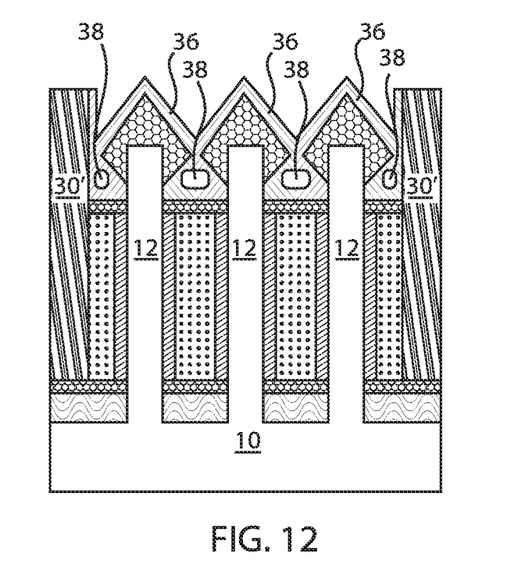
FIG. 12 is a cross-sectional view of the semiconductor structure of FIG. 11 where a dielectric film is deposited to pinch off and create air-gaps between the top sections of each of the plurality of fins, in accordance with an embodiment of the present invention.

FIG. 12 is a cross-sectional view of the semiconductor structure of FIG. 11 where a dielectric film is deposited to pinch off and create air-gaps between the top sections of each of the plurality of fins, in accordance with an embodiment of the present invention.

In an exemplary embodiment, a dielectric film 36 is deposited over the top source/drain regions 34 and within the void regions 44. The top source/drain regions 34 can be referred to as top S/D diamond epitaxy regions. The dielectric film 36 can be a low-k film growth for pinch-off. The deposition of the dielectric film 36 also creates air-gaps 38 between the top sections of the plurality of fins 12 and between the top source/drain regions 34. The air-gaps 38 can be substantially aligned with the gate conductors 26. The air-gaps 38 can be created by pinch-off of the dielectric film 36. For example, portions of the epitaxial material 34 can act as an umbrella or shield when the dielectric film 36 is deposited. This shielding effect due to the shape of the top source/drain regions 34 causes air-gaps 38 to be formed between the top sections of the plurality of fins 12. The air-gaps 38 aid in the reduction of parasitic capacitance and insertion loss.

Figure 13:
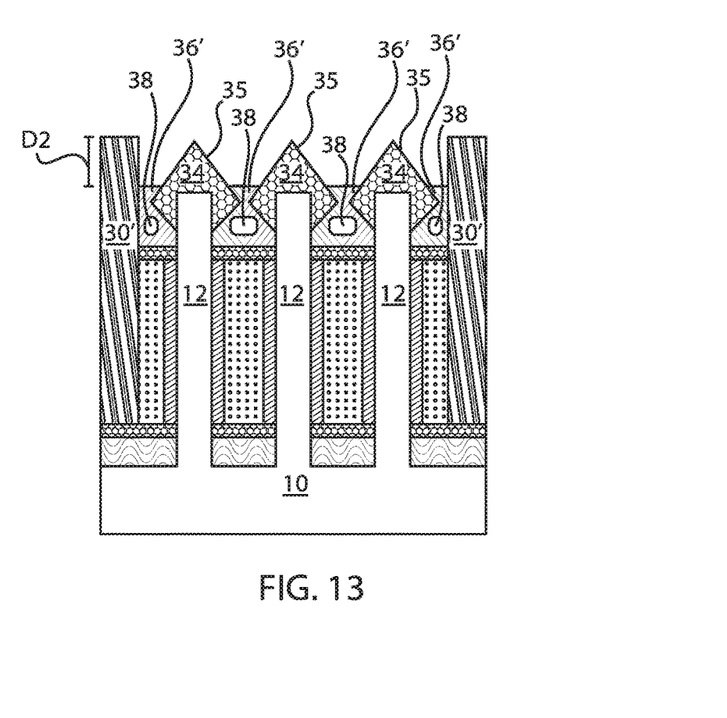
FIG. 13 is a cross-sectional view of the semiconductor structure of FIG. 12 where the dielectric film is selectively etched to expose top surfaces of the top source/drain regions, in accordance with another embodiment of the present invention.

FIG. 13 is a cross-sectional view of the semiconductor structure of FIG. 12 where the dielectric film is selectively etched to expose top surfaces of the top source/drain regions, in accordance with another embodiment of the present invention.

In an exemplary embodiment, the dielectric film 36 is selectively recessed to film 36' to expose top surfaces 35 of the top source/drain regions 34. The exposed portions or sections of the top source/drain regions 34 extend a distance D2 over the recessed film 36'. The air-gaps 38 remain intact by the recessing of the dielectric film 36. The film 36' continues to contact each of the top source/drain regions 34.

Figure 14:
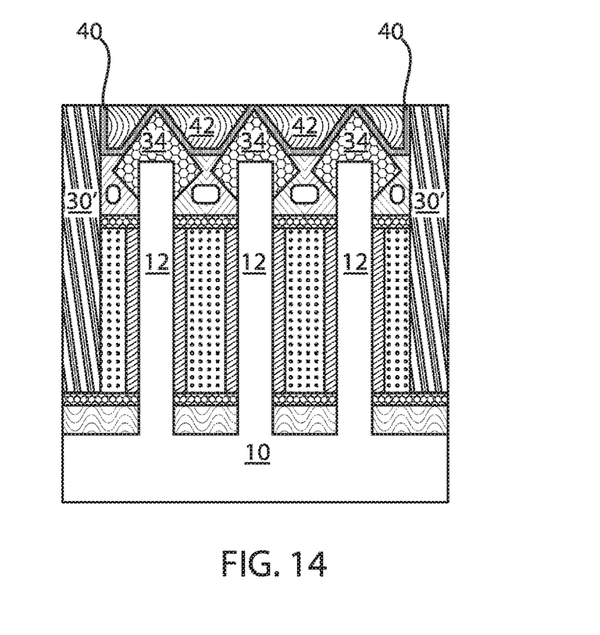
FIG. 14 is a cross-sectional view of the semiconductor structure of FIG. 13 where a metal fill takes place, in accordance with another embodiment of the present invention.

FIG. 14 is a cross-sectional view of the semiconductor structure of FIG. 13 where a metal fill takes place, in accordance with another embodiment of the present invention.

In an exemplary embodiment, a conductive material 42 is formed over the exposed top source/drain regions 34. The conductive material 42 can be referred to as a metal fill. The metal fill 42 can be, e.g., tungsten (W) or cobalt (Co) with silicide metal liner 40 such as titanium (Ti) and/or titanium nitride (TiN). The silicide metal liner 40 aids in the reduction of contact resistance. Compared to convention devices, the silicide metal liner 40 has an increased surface area (due to the diamond shape of the epitaxial material 34). Thus, the junction contact resistance can be reduced through an increased silicidation area. Moreover, parasitic capacitance reduction can result from the air-gaps or air spacers formed in the low-k dielectric liner, which, in turn, results in electronic performance improvement.

Regarding FIGS. 1-14, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for reducing contact resistance and parasitic capacitance (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for reducing contact resistance and parasitic capacitance, the method comprising:
    forming a bottom source/drain region between a plurality of fins;
    forming a bottom spacer over the bottom source/drain region;
    forming high-k metal gates (HKMGs) over the bottom spacer;
    forming a top spacer over the HKMGs and an interlayer dielectric (ILD) over the top spacer;
    recessing the ILD to expose top sections of the plurality of fins;
    depositing an epitaxial material over the top sections of the plurality of fins; and
    forming a dielectric film over the epitaxial material such that air-gaps are created over the top spacer, the dielectric film recessed to expose top sections of the epitaxial material and to deposit a silicide metal liner and a conductive material thereon.

2. The method of claim 1, wherein a relationship between a shape of the epitaxial material and the dielectric film allows for pinch-off resulting in the air-gaps.

3. The method of claim 2, wherein the shape of the epitaxial material is substantially diamond-shaped.

4. The method of claim 1, wherein a shape of the epitaxial material allows for the silicide metal liner to have an increased surface area.

5. The method of claim 1, wherein the air-gaps are substantially aligned with respective high-k metal gates formed between the plurality of fins.

6. The method of claim 1, wherein the air-gaps are formed below a top surface of the plurality of fins.

7. The method of claim 1, wherein the top spacer remains below a top surface of the plurality of fins after the recessing of the ILD.

8. A method for reducing contact resistance and parasitic capacitance, the method comprising:

forming a plurality of fins over a semiconductor substrate;
forming high-k metal gates between the plurality of fins;
depositing an interlayer dielectric (ILD) between the plurality of fins;
recessing the ILD to expose top sections of the plurality of fins;
depositing an epitaxial material over each of the top sections of the plurality of fins; and
forming a low-k dielectric film over the epitaxial material such that air-gaps are created between the top sections of the plurality of fins and over a top spacer formed over the high-k metal gates.

9. The method of claim 8, further comprising forming a bottom source/drain region between the plurality of fins before forming the high-k metal gates.

10. The method of claim 9, further comprising forming a bottom spacer over the bottom source/drain region before forming the high-k metal gates.

11. The method of claim 10, further comprising forming the top spacer before depositing the ILD.

12. The method of claim 11, further comprising recessing the low-k dielectric film to expose top sections of the epitaxial material.

13. The method of claim 12, further comprising depositing a silicide metal liner and a conductive material thereon.

14. The method of claim 13, wherein a shape of the epitaxial material allows for the silicide metal liner to have an increased surface area.

15. The method of claim 14, wherein a relationship between the shape of the epitaxial material and the low-k dielectric film allows for pinch-off resulting in the air-gaps.

16. The method of claim 15, wherein the shape of the epitaxial material is substantially diamond-shaped.

17. A semiconductor structure for reducing contact resistance and parasitic capacitance, the structure comprising:
 a bottom source/drain region disposed between a plurality of fins;
 a bottom spacer disposed over the bottom source/drain region;
 high-k metal gates (HKMGs) disposed over the bottom spacer;
 a top spacer located over the HKMGs;
 an interlayer dielectric (ILD) disposed over the top spacer such that top sections of the plurality of fins are exposed;
 an epitaxial material disposed over each of the top sections of the plurality of fins;
 a dielectric film located over the epitaxial material such that air-gaps are created over the top spacer; and
 a silicide metal liner and a conductive material disposed over the exposed top sections of the epitaxial material after recessing the dielectric film.

18. The structure of claim 17, wherein a shape of the epitaxial material allows for the silicide metal liner to have an increased surface area.

19. The structure of claim 18, wherein a relationship between a shape of the epitaxial material and the dielectric film allows for pinch-off resulting in the air-gaps.

20. The structure of claim 19, wherein the shape of the epitaxial material is substantially diamond-shaped.

* * * * *